(12) United States Patent
Park et al.

(10) Patent No.: US 9,096,705 B2
(45) Date of Patent: Aug. 4, 2015

(54) BLOCK COPOLYMER FOR MANUFACTURING NANOWIRE AND METHOD FOR MANUFACTURING THEREOF

(71) Applicant: UNIST Academy-Industry Research Corporation, Ulsan (KR)

(72) Inventors: Sooiin Park, Ulsan (KR); Jaephil Cho, Ulsan (KR); Hyun-Kon Song, Ulsan (KR); Byoungman Bang, Gyeongsan-si (KR)

(73) Assignee: UNIST ACADEMY-INDUSTRY RESEARCH CORPORATION, Ulsan (KR)

( * ) Notice: Subject to any disclaimer, the term of this patent is extended or adjusted under 35 U.S.C. 154(b) by 230 days.

(21) Appl. No.: 13/624,311

(22) Filed: Sep. 21, 2012

(65) Prior Publication Data

US 2013/0020278 A1   Jan. 24, 2013

Related U.S. Application Data (63) Continuation of application No. PCT/KR2010/003136, filed on May 18, 2010.

(30) Foreign Application Priority Data

Mar. 22, 2010   (KR) .................. 10-2010-0025399

(51) Int. Cl.
*B44C 1/22* (2006.01)
*C08F 271/02* (2006.01)
(Continued)

(52) U.S. Cl.
CPC ........... *C08F 293/00* (2013.01); *B81C 1/00031* (2013.01); *C08F 297/00* (2013.01); *B81B 2203/0361* (2013.01);
(Continued)

(58) Field of Classification Search
CPC ..... C08F 293/00; C08F 297/00; B82Y 40/00; B82Y 30/00; B81C 2201/0149; B81B 2203/0361
USPC .......................................... 216/11
See application file for complete search history.

(56) References Cited

U.S. PATENT DOCUMENTS

| 6,504,134 B1* | 1/2003 | Sheu et al. ..................... 219/497 |
| 2003/0124850 A1* | 7/2003 | Minamihaba et al. ........ 438/689 |
| 2007/0200477 A1* | 8/2007 | Tuominen et al. ............ 313/309 |

FOREIGN PATENT DOCUMENTS

| KR | 10-2008-0098827 | 11/2008 |
| KR | 10-2009-0028246 | 3/2009 |

(Continued)

OTHER PUBLICATIONS

Byeong-Hyeok Sohn et al. (J. Am. Chem. Soc. 2001, 123, 12734-12735).*

(Continued)

*Primary Examiner* — Nadine Norton
*Assistant Examiner* — Mahmoud Dahimene
(74) *Attorney, Agent, or Firm* — Lexyoume IP Meister, PLLC (57) ABSTRACT

A block copolymer for manufacturing a nanowire and a method of manufacturing the same are disclosed. The block copolymer and the method of manufacturing a nanowire using the same are used to fabricate a nanowire having a diameter of less than or equal to 30 nm and a porous nanowire having a diameter within the same range and pores with a diameter of less than or equal to 10 nm.

4 Claims, 7 Drawing Sheets

(51) Int. Cl.
*C08F 293/00* (2006.01)
*C08F 297/00* (2006.01)
*B81C 1/00* (2006.01)
*B82Y 30/00* (2011.01)
*B82Y 40/00* (2011.01)

(52) U.S. Cl.
CPC ........ *B81C 2201/0149* (2013.01); *B82Y 30/00* (2013.01); *B82Y 40/00* (2013.01)

(56) References Cited

FOREIGN PATENT DOCUMENTS

| KR | 10-2009-0083091 | 8/2009 |
|---|---|---|
| KR | 10-2010-0022323 | 3/2010 |

OTHER PUBLICATIONS

Soojin Park et al., J. Mater. Chem. 2010, vol. 20, pp. 1198-1202, Oct. 8, 2009.

\* cited by examiner

BLOCK COPOLYMER FOR MANUFACTURING NANOWIRE AND METHOD FOR MANUFACTURING THEREOF

CROSS-REFERENCE TO RELATED APPLICATION

This is a continuation of international application no. PCT/KR2010/003136 filed on May 18, 2010, which claims priority to and the benefit of Korean Patent Application No. 10-2010-0025399 filed in the Korean Intellectual Property Office on Mar. 22, 2010, the entire contents of which are incorporated herein by reference.

BACKGROUND OF THE INVENTION (a) Field of the Invention

A block copolymer for manufacturing a nanowire and a method of manufacturing the same are related.

(b) Description of the Related Art

A silicon nanowire has unique characteristics applied to next generation electronic devices, biosensors, optoelectronic devices, energy devices, and the like, and thus has been actively researched for several years.

In order to be efficiently applied to the above devices, a method of fabricating a silicon nanowire having a uniform diameter and controlled regarding length is required.

SUMMARY OF THE INVENTION

One aspect of the present invention provides a block copolymer for a nanowire having a uniform diameter and controlled regarding length, and a method of manufacturing a fine nanowire using the block copolymer.

In another aspect of the present invention, a block copolymer for manufacturing a nanowire is represented by the following Chemical Formula 1.

A-block-B            [Chemical Formula 1]

The A and B are different from each other and are independently selected from the group consisting of polystyrene, polyisoprene, poly(2-alkenylene pyridine), poly(4-alkenylene pyridine), poly(alkylene oxide), poly(caprolactone), poly(lactide), poly(alkyl(meth)acrylate), poly(meth)acrylic acid, poly($\alpha$-alkyl styrene), poly(styrene sulfonate), polybutadiene, polyurethane, and poly(meth)acrylonitrile.

The block copolymer represented by the above Chemical Formula 1 may have a molecular weight of 5 to 500 kg/mol.

The block copolymer for manufacturing a nanowire may have a spherical micelle structure or a vertically-arranged cylindrical structure on a substrate.

In another aspect of the present invention, provided is a method of manufacturing a nanowire that includes (a) preparing a substrate for manufacturing a nanowire, (b) preparing a block copolymer for manufacturing a nanowire, (c) mixing the block copolymer prepared in the step (b) with a solvent and applying the resultant on the substrate prepared in the step (a) to form a block copolymer layer, (d) etching the applied block copolymer layer to form a pattern, (e) forming a metal-coating layer on the patterned substrate in the step (d), and (f) reacting a solution including acid and peroxide with the metal-coating layer in the step (e).

The substrate for manufacturing a nanowire may be a silicon substrate.

The block copolymer and solvent in the step (c) may be mixed in a ratio of the block copolymer in an amount of 0.1 to 1.0 wt % based on 100 wt % of the total amount of the block copolymer and solvent.

The applying in the step (c) may be done through spin-coating.

The spin-coating may be performed at 1500 to 8000 rpm.

The block copolymer layer in the step (c) may be 10 to 150 nm thick.

The etching in the step (d) may be performed using at least one mixed gas selected from the group consisting of oxygen plasma, $CF_4$ plasma, $CHF_3$ plasma, and $SF_6$ plasma.

The metal-coating layer in the step (e) may be formed using a method selected from the group consisting of thermal evaporation, e-beam evaporation, a liquid-phase method, and sputtering.

The metal-coating layer in the step (e) may be 10 to 50 nm thick.

In the solution including acid and peroxide in the step (f), the acid may be hydrogen fluoride (HF), hydrochloric acid (HCl), or a combination thereof.

The peroxide in the solution including acid and peroxide in the step (f) may be hydrogen peroxide ($H_2O_2$).

The silicon substrate may be 10 to 1000 μm thick.

The block copolymer may be represented by the following Chemical Formula 1.

A-block-B            [Chemical Formula 1]

The A and B are different from each other and independently selected from the group consisting of polystyrene, polyisoprene, poly(2-alkenylene pyridine), poly(4-alkenylene pyridine), poly(alkylene oxide), poly(caprolactone), poly(lactide), poly(alkyl(meth)acrylate), poly(meth)acrylic acid, poly($\alpha$-alkyl styrene), poly(styrene sulfonate), polybutadiene, polyurethane, and poly(meth)acrylonitrile.

The block copolymer represented by the above Chemical Formula 1 may have a molecular weight of 5 to 500 kg/mol.

The block copolymer for manufacturing a nanowire may have a spherical micelle structure or a vertically-arranged cylindrical structure on a substrate.

The metal layer in the step (e) may include at least one metal selected from the group consisting of silver (Ag), gold (Au), platinum (Pt), and copper (Cu).

The solvent in the step (c) may be at least one selected from the group consisting of toluene, tetrahydrofuran, dimethyl formamide, ethanol, methanol, acetone, hexane, heptane, octane, cyclohexane, and ethylbenzene.

In yet another aspect of the present invention, provided is a method of manufacturing a nanowire that includes (a) preparing a substrate for manufacturing a nanowire, (b) preparing a block copolymer for manufacturing a nanowire, (c) mixing the block copolymer prepared in the step (b) with a solvent and adding a metal salt thereto to prepare a mixed solution, (d) applying the mixed solution prepared in the step (c) on the substrate prepared in the step (a) to form a metal salt-block copolymer layer, (e) plasma-treating the metal salt-block copolymer layer to form a metal oxide pattern, (f) forming a metal coating layer on the patterned substrate in the step (e), and (g) reacting a solution including acid and peroxide with the metal coating layer in the step (f).

The substrate for manufacturing a nanowire may be a silicon substrate.

The block copolymer and solvent in the step (c) may be mixed at a ratio of the block copolymer in an amount of 0.1 to 1.0 wt % based on 100 wt % of the total amount of the block copolymer and solvent.

The applying in the step (c) may be done through spin-coating.

The spin-coating may be performed at 1500 to 8000 rpm.

The metal salt-block copolymer layer in the step (d) may be 10 to 150 nm thick.

The plasma-treatment in the step (e) may be performed using oxygen plasma.

The metal coating layer in the step (f) may be performed using a method selected from the group consisting of thermal evaporation, e-beam evaporation, a liquid-phase method, and sputtering.

The metal coating layer in the step (f) may be of 10 to 50 nm thick. The solution including acid and peroxide in the step (g) may include acid selected from hydrogen fluoride (HF), hydrochloric acid (HCl), or a combination thereof.

The peroxide in the solution including acid and peroxide in the step (g) may be hydrogen peroxide ($H_2O_2$).

The silicon substrate may have a thickness of 10 to 1000 μm.

The block copolymer may be represented by the following Chemical Formula 1.

A-block-B            [Chemical Formula 1]

The A and B are different from each other and are independently selected from the group consisting of polystyrene, polyisoprene, poly(2-alkenylene pyridine), poly(4-alkenylene pyridine), poly(alkylene oxide), poly(caprolactone), poly(lactide), poly(alkyl(meth)acrylate), poly(meth)acrylic acid, poly(α-alkyl styrene), poly(styrene sulfonate), polybutadiene, polyurethane, and poly(meth)acrylonitrile.

The metal salt in the step (c) may be included in a mole ratio of 0.1 to 1.0 based on one equivalent of either of the block copolymer A or B.

The block copolymer represented by the above Chemical Formula 1 may have a molecular weight of 5 to 500 kg/mol.

The block copolymer for manufacturing a nanowire may have a spherical micelle structure or a vertically-arranged cylindrical structure on the substrate.

The metal coating layer in the step (f) may include at least one metal selected from the group consisting of silver (Ag), gold (Au), platinum (Pt), and copper (Cu).

The solvent in the step (c) may be at least one selected from the group consisting of toluene, tetrahydrofuran, dimethyl formamide, ethanol, methanol, acetone, hexane, heptane, octane, cyclohexane, and ethylbenzene.

The metal salt in the step (c) may be at least one selected from the group consisting of $FeCl_2$, $FeCl_3$, $K_3[Fe(CN)_6]$, and $FeSO_4$.

The metal oxide in the step (e) may be iron oxide.

Therefore, the present invention may provide an effective block copolymer for manufacturing a nanowire.

In addition, the present invention may provide a nanowire having a diameter of less than or equal to 30 nm and also a porous nanowire having a diameter within the diameter range and pores having a diameter of less than or equal to 10 nm according to a method of using the block copolymer.

DETAILED DESCRIPTION OF THE EMBODIMENTS

Hereinafter, embodiments of the present invention are described. However, these embodiments are only exemplary, and the present invention is not limited thereto.

In the present specification, "molecular weight" of a polymer may refer to "weight average molecular weight (Mw)".

In the present specification, "(meth)acrylate" refers to "methacrylate" and "acrylate", and "(meth)acrylonitrile" refers to "methacrylonitrile" and "acrylonitrile".

In the present specification, "alkyl" refers to a substituted or unsubstituted C1 to C10 alkyl.

In the present specification, "alkylene" refers to a substituted or unsubstituted C1 to C10 alkylene.

In the present specification, when a definition is not otherwise provided, "substituted" refers to one substituted with a C1 to C30 alkyl group; a C1 to C10 alkylsilyl group; a C3 to C30 cycloalkyl group; a C6 to C30 aryl group; a C2 to C30 heteroaryl group; a C1 to C10 alkoxy group; a fluoro group, a C1 to C10 trifluoroalkyl group such as a trifluoromethyl group and the like; or a cyano group.

In one embodiment of the present invention, a block copolymer for manufacturing a nanowire is represented by the following Chemical Formula 1.

A-block-B            [Chemical Formula 1]

The A and B are different from each other and are independently selected from the group consisting of polystyrene, polyisoprene, poly(2-alkenylene pyridine), poly(4-alkenylene pyridine), poly(alkylene oxide), poly(caprolactone), poly(lactide), poly(alkyl methacrylate), poly(meth)acrylic acid, poly(α-alkyl styrene), poly(styrene sulfonate), polybutadiene, polyurethane, and poly(meth)acrylonitrile.

Specific examples of the poly(alkylene oxide) may include poly(ethylene oxide), poly(propylene oxide), and the like.

Specific examples of the poly(alkyl(meth)acrylate) may include poly(methyl methacrylate), poly(ethyl methacrylate), poly(butyl methacrylate), and the like.

Specific examples of the poly(α-alkylstyrene) may include poly(α-methylstyrene), poly(α-ethylstyrene), and the like.

Specific examples of the poly(2-alkenylene pyridine) may include poly(2-vinyl pyridine) and the like.

Specific examples of the poly(4-alkenylene pyridine) may include poly(4-alkenylene pyridine) and the like.

The block copolymer may have a spherical micelle structure or a vertically-arranged cylindrical structure on the substrate. The structure of the block copolymer may make it possible to form a pattern for fabricating a nanowire. This will be illustrated later.

The block copolymer represented by the above Chemical Formula 1 may have a molecular weight of 5 to 500 kg/mol. When the block copolymer has a molecular weight within the range, a nanostructure may be easily fabricated. However, when the molecular weight is out of the range, a nanostructure may rarely be or may not be fabricated.

Accordingly, a nanowire may have a diameter that is adjusted by the molecular weight of the block copolymer.

In another embodiment of the present invention, provided is a method of manufacturing a nanowire that includes (a) preparing a substrate for manufacturing a nanowire, (b) preparing a block copolymer for manufacturing a nanowire, (c) mixing the block copolymer prepared in the step (b) with a solvent and applying the resultant on the substrate prepared in the step (a) to form a block copolymer layer, (d) etching the applied block copolymer layer to form a pattern, (e) forming a metal coating layer on the patterned substrate in the step (d), and (f) reacting a solution including an acid and peroxide with the metal coating layer in the step (e).

The substrate for manufacturing a nanowire may be a silicon substrate.

The silicon substrate may have better capacity than a conventional carbon active material. The silicon substrate may be fabricated to have a nanowire structure and thus a maximized surface area as shown in one embodiment of the present invention.

The silicon substrate may have a sheet resistance value of less than or equal to 0.008 Ω·cm or greater than or equal to 0.1 Ω·cm and a crystalline phase (100), (110), or (111). The silicon substrate has low sheet resistance when doped with a lot of boron (B) or phosphorus (P). On the contrary, the silicon substrate has high sheet resistance when doped with a little boron (B) or phosphorus (P). A silicon wafer having low resistance may be etched by a metal catalyst and thus is fabricated into a silicon nanowire having pores with a diameter of less than or equal to 10 nm, while a silicon wafer having high resistance may be etched by a metal catalyst and thus is fabricated into a non-porous silicon nanowire.

On the other hand, a non-porous silicon substrate may be fabricated into a non-porous silicon nanowire, while a porous silicon substrate may be fabricated into a porous silicon nanowire.

The silicon substrate may be 10 to 1000 μm thick. When the silicon substrate has a thickness within the range, it may have a wire structure. When the silicon wafer is too thin, the silicon wafer is not only hard to handle, but a resulting nanowire is too short. On the contrary, when the silicon wafer is too thick, a nanowire may be fabricated but much is lost.

The block copolymer is the same as a block copolymer for manufacturing a nanowire used in the aforementioned embodiment and thus will not be illustrated.

However, the block copolymer for manufacturing a nanowire may have a spherical micelle structure or a vertically-arranged cylindrical structure on the substrate as aforementioned. The vertically-arranged cylindrical structure on the substrate may be formed through a thermal annealing or solvent annealing process.

Specifically, a block copolymer having a cylindrical structure includes one block in a volume ratio ranging from 25 to 35 volume % and the other block in a volume ratio ranging from 65 to 75 volume %.

In the vertically-arranged cylindrical structure, a block working as a main chain may be removed by UV (254 or 365 nm), ozone ($O_3$ gas), heat treatment, and the like.

For example, a poly(methyl(methacrylate) polymer may be decomposed by radiating a UV wavelength of 254 nm. In addition, a polylactide polymer may be decomposed with UV at 365 nm. A polyisoprene or polybutadiene polymer may be removed by oxygen plasma, and other particular polymers may be thermally decomposed.

The block copolymer and solvent in the step (c) may be mixed at a ratio of the block copolymer in an amount of 0.1 to 1.0 wt % based on 100 wt % of the total amount of the block copolymer and solvent. When the block copolymer and solvent are mixed within the range, a single-layered uniform nanostructure may be arranged on the substrate (e.g., a silicon wafer). However, when the block copolymer and solvent are mixed out of the range, a multi-layered nanostructure is formed, but a desired nanowire may rarely be obtained.

The solvent in the step (c) may be at least one selected from the group consisting of toluene, tetrahydrofuran, dimethyl formamide, ethanol, methanol, acetone, hexane, heptane, octane, cyclohexane, and ethylbenzene.

The applying in the step (c) may be a spin-coating. The spin-coating may be performed at 1500 to 8000 rpm. The spin-coating range is optimal for effectively applying the block copolymer.

The block copolymer layer in the step (c) may be 10 to 150 nm thick. When the block copolymer layer has a thickness within the range, a uniform single-layered nanostructure may be obtained.

The etching in the step (d) may be may be performed using at least one mixed gas selected from the group consisting of oxygen plasma, $CF_4$ plasma, $CHF_3$ plasma, and $SF_6$ plasma. The etching may be performed with a power of 30 to 100 watts for 10 seconds to 1 hour. These conditions may bring about optimal etching for effectively forming a nanopattern. In other words, the etching conditions are optimal for securing a distance among nanosized micelles.

The metal-coating layer in the step (e) may include at least one metal selected from the group consisting of silver (Ag), gold (Au), platinum (Pt), and copper (Cu). The metal-coating layer may play a role of a catalyst for etching the substrate.

The metal-coating layer in the step (e) may be formed using a method selected from the group consisting of thermal evaporation, e-beam evaporation, a liquid-phase method, and sputtering. The metal coating layer in the step (e) may be 10 to 50 nm thick.

The liquid-phase method forms a metal-coating layer using an acid aqueous solution and an aqueous solution including a metal salt used for the metal coating layer. The acid aqueous solution may include HF, HCl, and the like, and the metal salt aqueous solution may include a silver nitrate aqueous solution, silver acetate, silver iodide, and the like.

The acid aqueous solution may have an acid concentration ranging from 5 to 20 wt % based on 100 wt % of the entire acid aqueous solution, and the metal salt aqueous solution may have a concentration ranging from 0.01 to 0.05 wt % based on 100 wt % of the entire metal salt aqueous solution. The liquid-phase method is performed for 30 seconds to 5 minutes. The reaction is performed at a temperature of 20 to 80° C.

The liquid-phase method is specifically illustrated as follows. According to the liquid-phase method, a substrate having the pattern is dipped in a mixed solution of a HF aqueous solution as the acid aqueous solution and a silver nitrate aqueous solution as the metal salt aqueous solution.

The substrate (e.g., a silicon substrate) may be selectively etched after forming the metal-coating layer. Herein, the substrate may be selectively etched where it directly contacts the metal. In other words, a block copolymer pattern in the step (d) may play a role of blocking the substrate from being etched.

The substrate may be selectively etched when the solution in the step (f) reacts with the metal coating layer in the step (e). In other words, the substrate may be etched where it directly contacts the metal coating layer.

In the solution including acid and peroxide in the step (f), the acid and peroxide may be included as an aqueous solution.

The acid aqueous solution may include an acid concentration ranging from 1 to 20 wt % based on 100 wt % of the entire acid aqueous solution, and the peroxide aqueous solution may have a peroxide concentration ranging from 0.5 to 3 wt % based on 100 wt % of the entire peroxide aqueous solution. When the above solutions have a concentration within the range, a uniform silicon nanowire may be obtained. When the above solutions have a low concentration out of the range, an etching reaction may not be performed by a metal catalyst, while when the above solutions have a high concentration out of the range, an etching reaction may be fervently performed, obtaining no uniform nanowire.

The reaction in the step (f) has no limit but may be performed by, for example, dipping the substrate disposed with the metal coating layer in the solution including the acid and peroxide. Herein, the reaction may be sufficiently performed for 30 seconds to 3 hours.

In the solution including the acid and peroxide in the step (f), the acid may include at least one selected from the group consisting of hydrogen fluoride (HF) or hydrochloric acid (HCl), and the peroxide may include at least one selected from the group consisting of hydrogen peroxide ($H_2O_2$).

When there is no peroxide, a mixed solution of silver nitrate and HF may be hydrothermally reacted.

The etching reaction is illustrated referring to the following specific examples.

[Reaction Scheme 1]

$$Si + 2H_2O_2 + 6HF \rightarrow H_2SiF_6 + 4H_2O$$

According to the embodiment of the present invention, the substrate may be a silicon substrate, the acid may be HF, and the peroxide may be $H_2O_2$. The Si substrate may be etched in the reaction. Herein, a metal in the metal coating layer may play a role of a catalyst for the reaction.

Then, a nanowire fabricated according to the manufacturing method may be coated with an epoxy-based polymer, poly(meth)acrylonitrile, resorcinol-formaldehyde (RF gel), resol, sugar, and the like.

In addition, the nanowire may be carbonized at a temperature of 600 to 1000° C.

According to the manufacturing method, a nanowire having a diameter of less than or equal to 30 nm may be prepared, and a porous nanowire having a diameter within the range and pores with a diameter of less than or equal to 10 nm may be fabricated.

The nanowire may be used as a negative active material for a lithium rechargeable battery. For example, when a silicon nanowire is used to prepare a negative active material, the negative active material has better capacity than a conventional negative active material. The reason is that the silicon nanowire has a remarkably enlarged specific surface area due to a small diameter.

In yet another embodiment of the present invention, provided is a method of manufacturing a nanowire that includes (a) preparing a substrate for manufacturing a nanowire, (b) preparing a block copolymer for manufacturing a nanowire, (c) mixing the block copolymer prepared in the step (b) with a solvent and adding a metal salt thereto to prepare a mixed solution, (d) applying the mixed solution prepared in the step (c) on the substrate prepared in the step (a) to form a metal salt-block copolymer layer, (e) plasma-treating the metal salt-block copolymer layer to form a metal oxide pattern, (f) forming a metal coating layer on the substrate on which the pattern is formed in the step (e), and (g) reacting a solution including acid and peroxide with the metal coating layer in the step (f).

The method according to the embodiment of the present invention is the same as the aforementioned except for a few differences, and thus will not be repetitively explained.

According to the embodiment of the present invention, a metal salt-block copolymer layer is used instead of a block copolymer layer used in the aforementioned embodiment. Accordingly, the block copolymer is mixed with a solvent, and a metal salt may be added thereto.

The metal salt-block copolymer layer in the step (d) may be 10 to 150 nm thick, because of the same reason as aforementioned.

The plasma treatment in the step (e) may be performed using oxygen plasma. The oxygen plasma treatment may oxidize a metal salt into a metal oxide and simultaneously decompose a block copolymer and remove the metal oxide on the surface of the substrate. On the other hand, the metal oxide remaining on the substrate may have a predetermined pattern.

The oxygen plasma may be treated with 30 to 100 watts for 10 minutes to 2 hours. Under these conditions, the metal salt may be sufficiently oxidized and the block copolymer may be simultaneously removed.

Thereafter, a metal coating layer is formed on the pattern, and the substrate is etched in the same step as aforementioned.

In other words, a block copolymer structure (e.g., a micelle) according to the aforementioned embodiment may play a role of a pattern preventing the substrate from being etched, while the metal oxide may prevent the substrate from being etched according to the embodiment of the present invention.

The mixed solution in the step (c) may be agitated for 6 to 24 hours.

The metal salt in the step (c) may be included in a mole ratio of 0.1 to 1.0 related to one equivalent of either block copolymer A or B represented by the above Chemical Formula 1.

When the metal salt is used within the range, iron or iron oxide nanoparticles having a uniform size may be arranged. However, when the metal salt is included out of the range of 0.1 to 1.0 related to one equivalent of the block copolymer, no nanoparticle is formed.

The metal salt in the step (c) may be at least one selected from the group consisting of $FeCl_2$, $FeCl_3$, $K_3[Fe(CN)_6]$, and $FeSO_4$, and the metal oxide in the step (e) may be an iron oxide.

Specific examples of the iron oxide may be $Fe_2O_3$, $Fe_3O_4$, and the like.

The following examples illustrate the present invention in more detail. These examples, however, should not in any sense be interpreted as limiting the scope of the present invention.

EXAMPLES

Example 1

Figure 1:
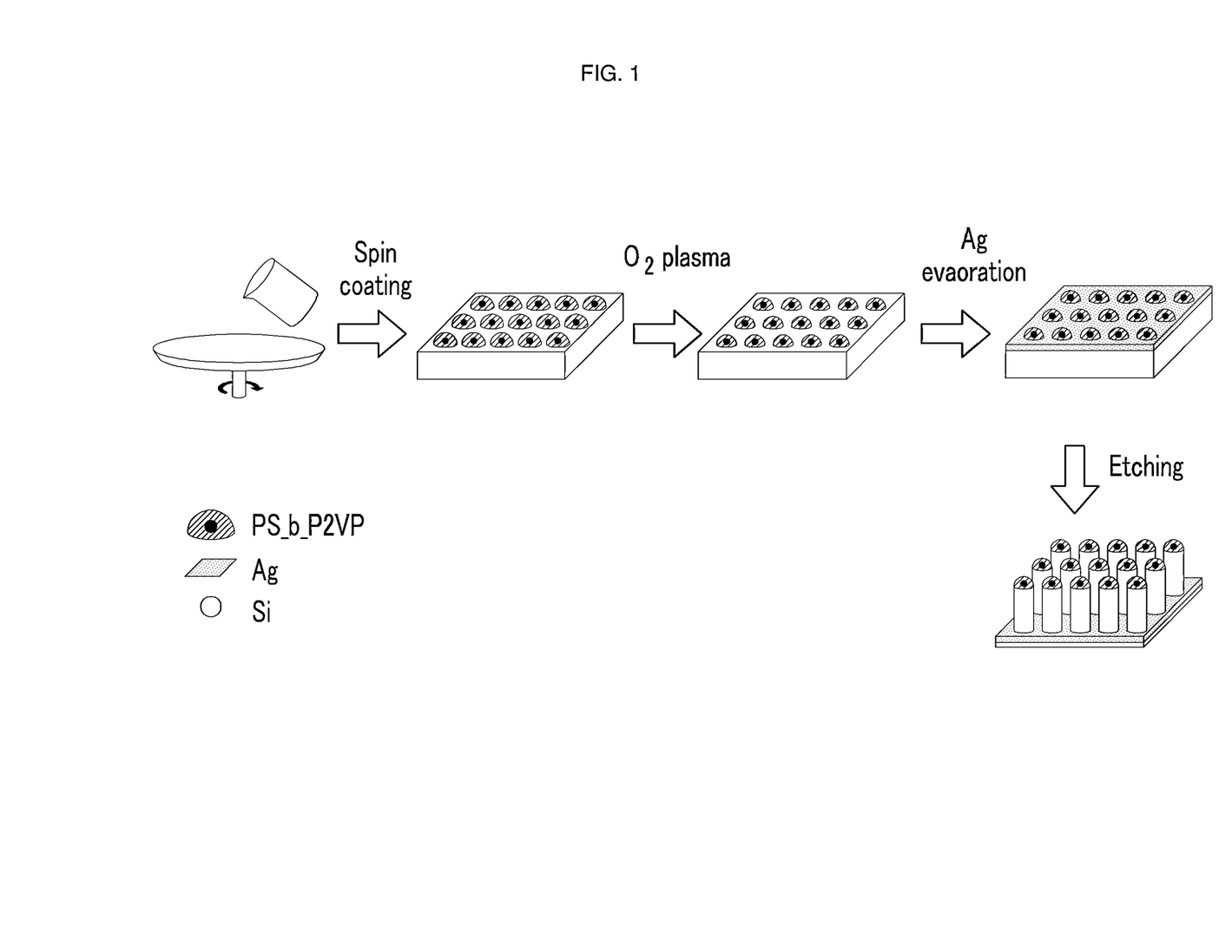
FIG. 1 is a schematic view showing a method of manufacturing a silicon nanowire according to one embodiment of the present invention.

Fabrication of Nanowire Using Block Copolymer Having Molecular Weight of 184 kg/mol and Non-Porous Silicon Substrate FIG. 1 is a flowchart showing a method of manufacturing a silicon nanowire according to one embodiment of the present invention.

First, a polystyrene-block-poly(2-vinyl pyridine) block copolymer having a molecular weight of 184 kg/mol was dissolved in xylene (ortho- or meta-), preparing a spherical block copolymer micelle solution including 0.5 wt % of the block copolymer based on 100 wt % of the solution.

The solution was spin-coated on a silicon substrate at a speed ranging from 2000 to 4000 rpm for about 1 minute.

Next, a micelle pattern was formed by treating $O_2$ plasma in an overlapped region among block copolymer micelles on the substrate for 30 seconds.

Then, an approximately 15 to 30 nm-thick silver layer was deposited through thermal evaporation on the micelle pattern.

On the other hand, a mixed solution was prepared by mixing 10 mL of a hydrogen fluoride aqueous solution including 10 wt % of hydrogen fluoride based on 100 wt % of the entire aqueous solution and 10 mL of a hydrogen peroxide aqueous solution including 1.2 wt % of hydrogen peroxide based on 100 wt % of the entire aqueous solution.

Then, the silicon substrate deposited with the silver layer was dipped in the mixed solution for about 3 minutes, selectively etching where the silicon substrate contacts the silver layer and fabricating silicon nanowire.

Example 2

Figure 2:
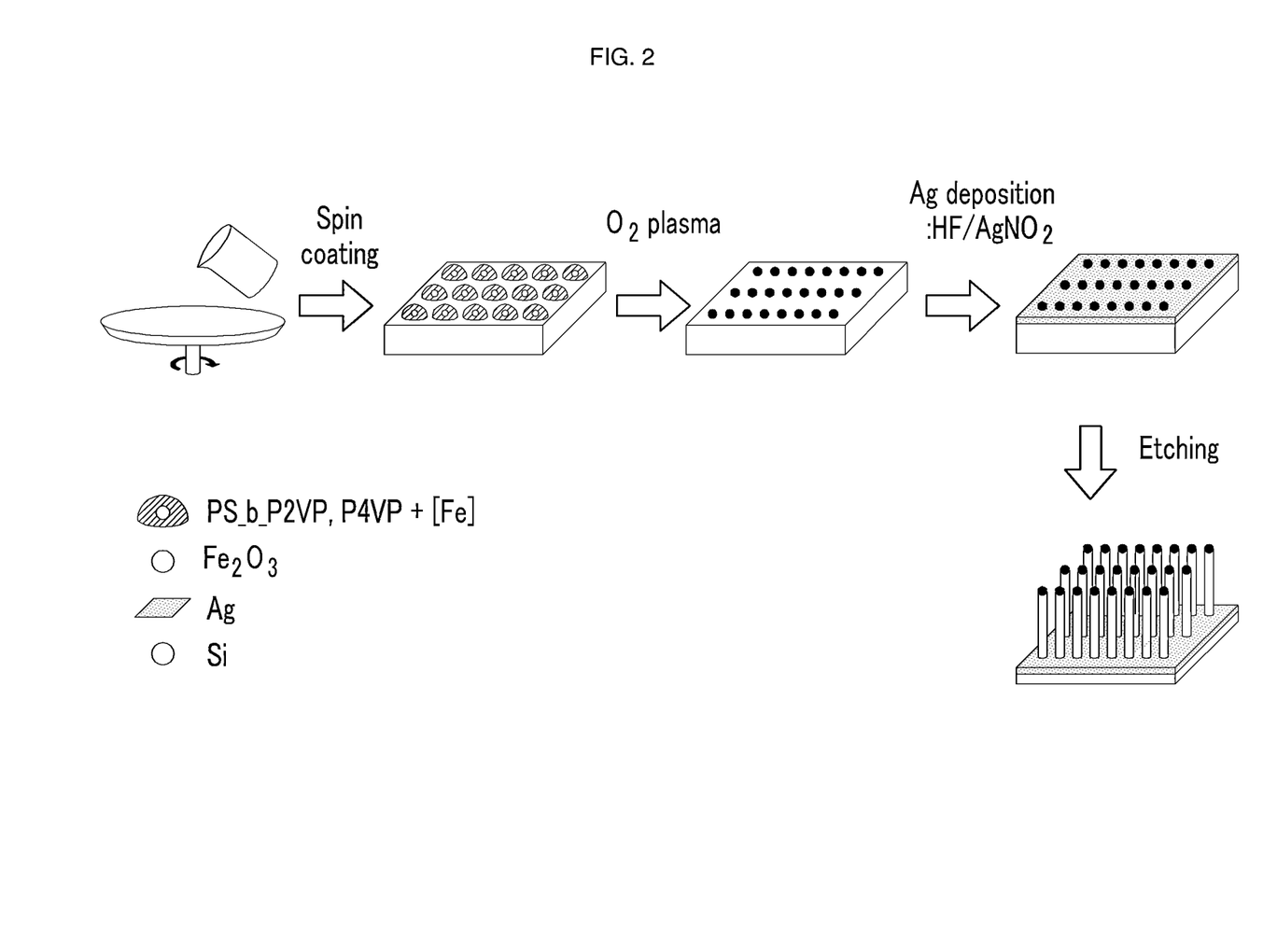
FIG. 2 is a schematic view showing a method of manufacturing a silicon nanowire according to another embodiment of the present invention.

Fabrication of Nanowire Using Block Copolymer Having Molecular Weight of 265 kg/mol and Non-Porous Silicon Substrate FIG. 2 is a flowchart showing a method of manufacturing a silicon nanowire according to another embodiment of the present invention.

First of all, a polystyrene-block-poly(2-vinyl pyridine) block copolymer having a molecular weight of 265 kg/mol was dissolved in toluene a spherical block copolymer micelle solution to include 0.5 wt % of an entire block copolymer based on 100 wt % of the entire solution.

Next, 0.5 equivalent of iron(III) chloride ($FeCl_3$) was added to the solution to substitute iron(III) chloride in the poly(2-vinyl pyridine) or poly(4-pyridine) block.

The solution substituted with the iron(III) chloride was spin-coated at a speed ranging from 3000 to 5000 rpm for about 1 minute on a silicon substrate having a sheet resistance value of greater than or equal to 0.1 $\Omega \cdot cm$. The silicon substrate had low sheet resistance value and thus might be a non-porous substrate.

Then, the coated silicon substrate was treated with oxygen plasma (50 watts) for 30 minutes to 1 hour to remove the block copolymer on the silicon substrate and to oxidize the iron(III) chloride into diiron trioxide ($Fe_2O_3$).

The silicon substrate having the diiron trioxide on the surface was supported by a mixed solution of a hydrogen fluoride aqueous solution including 10 wt % of hydrogen fluoride and a 0.02 M nitric acid aqueous solution in the same volume ratio based on 100 wt % of the entire aqueous solution. In this supporting process, a silver layer was formed on the surface of the substrate.

On the other hand, a mixed solution prepared by mixing 10 mL of a hydrogen fluoride aqueous solution including 10 wt % of hydrogen fluoride based on 100 wt % of the entire aqueous solution and of a hydrogen peroxide aqueous solution including 1.2 wt % of hydrogen peroxide based on 100 wt % of the entire aqueous solution.

Then, a silicon substrate deposited with a silver layer was dipped in the mixed solution for about 10 minutes, so that a silicon wire was fabricated by selectively etching where the silicon substrate contacted the silver.

Example 3

Fabrication of Nanowire Using Block Copolymer Having Molecular Weight of 31 kg/mol and Non-Porous Silicon Substrate A nanowire was fabricated according to the similar method to Example 2.

First, 0.5 wt % of a polystyrene-block-poly(2-vinyl pyridine) block copolymer having a molecular weight of 31 kg/mol was dissolved in toluene based on 100 wt % of the entire block copolymer, preparing a spherical block copolymer micelle solution.

Next, 0.5 equivalent of iron(III) chloride ($FeCl_3$) was added to the solution to substitute iron(III) chloride in the poly(2-vinyl pyridine) or poly(4-pyridine) block.

The iron(III) chloride-substituted solution was spin-coated on a silicon substrate having a sheet resistance value of greater than or equal to 0.1 $\Omega \cdot cm$ at a speed of 3000 to 5000 rpm for about 1 minute. The silicon substrate has low sheet resistance value and thus might be a non-porous substrate.

Next, the coated silicon substrate was treated with oxygen plasma (50 watts) for 30 minutes to 1 hour to remove a block copolymer on the silicon substrate and oxidize the iron(III) chloride into diiron trioxide ($Fe_2O_3$).

Then, the silicon substrate having the diiron trioxide surface was supported by a solution prepared by mixing a hydrogen fluoride aqueous solution including 10 wt % of hydrogen fluoride and a 0.02 M nitric acid aqueous solution in the same volume ratio based on 100 wt % of the entire aqueous solution. In this supporting process, a silver layer was formed on the surface of the substrate.

On the other hand, a mixed solution was prepared by mixing 10 mL of a hydrogen fluoride aqueous solution including 10 wt % of hydrogen fluoride based on 100 wt % of the entire aqueous solution and a hydrogen peroxide aqueous solution including 1.2 wt % of hydrogen peroxide based on 100 wt % of the entire aqueous solution.

Then, the silicon substrate deposited with a silver layer was dipped in the mixed solution for about 10 minutes, so that a silicon nanowire was fabricated by selectively etching where the silicon substrate contacted the silver.

Example 4

Fabrication of Nanowire Using Block Copolymer Having a Molecular Weight of 31 kg/mol and a Porous Silicon Substrate A nanowire was fabricated according to the same method as Example 2.

First of all, a polystyrene-block-poly(4-vinyl pyridine) block copolymer having a molecular weight of 31 kg/mol was dissolved in toluene, preparing a spherical block copolymer micelle solution including 0.5 wt % of the entire block copolymer based on 100 wt % of the solution.

Then, 0.5 equivalent of iron(III) chloride ($FeCl_3$) is added to the solution to substitute iron(III) chloride in the poly(2-vinyl pyridine) or poly(4-pyridine) block.

The iron(III) chloride-substituted solution was spin-coated at a speed of 3000 to 5000 rpm for about 1 minute on a silicon substrate having a sheet resistance value of less than or equal to 0.008 $\Omega \cdot cm$. The silicon substrate might be porous based on the above sheet resistance value.

Next, the coated silicon substrate was treated with oxygen plasma (50 watts) for 30 minutes to 1 hour to remove the block copolymer on the silicon substrate and oxidize the iron(III) chloride into diiron trioxide ($Fe_2O_3$).

Then, a solution was prepared by mixing a hydrogen fluoride aqueous solution including 10 wt % of hydrogen fluoride and a 0.02M silver nitrate aqueous solution in an equal volume ratio based on 100 wt % of the entire aqueous solution, and a silicon substrate having the diiron trioxide on the surface was supported by the solution. In this supporting process, a silver layer was formed on the surface of the substrate.

Furthermore, 10 mL of a hydrogen fluoride aqueous solution including 10 wt % of hydrogen fluoride based on 100 wt % of the entire aqueous solution and a hydrogen peroxide aqueous solution including 1.2 wt % of hydrogen peroxide based on 100 wt % of the entire aqueous solution were mixed to prepare a mixed solution.

Then, when the silicon substrate deposited with the silver layer was dipped in the mixed solution for about 10 minutes, the silicon substrate was selectively etched where it contacted the silver, forming silicon nanowires.

Experimental Example

Surface Scanning Electron Microscope (SEM) Analysis

Figure 3:
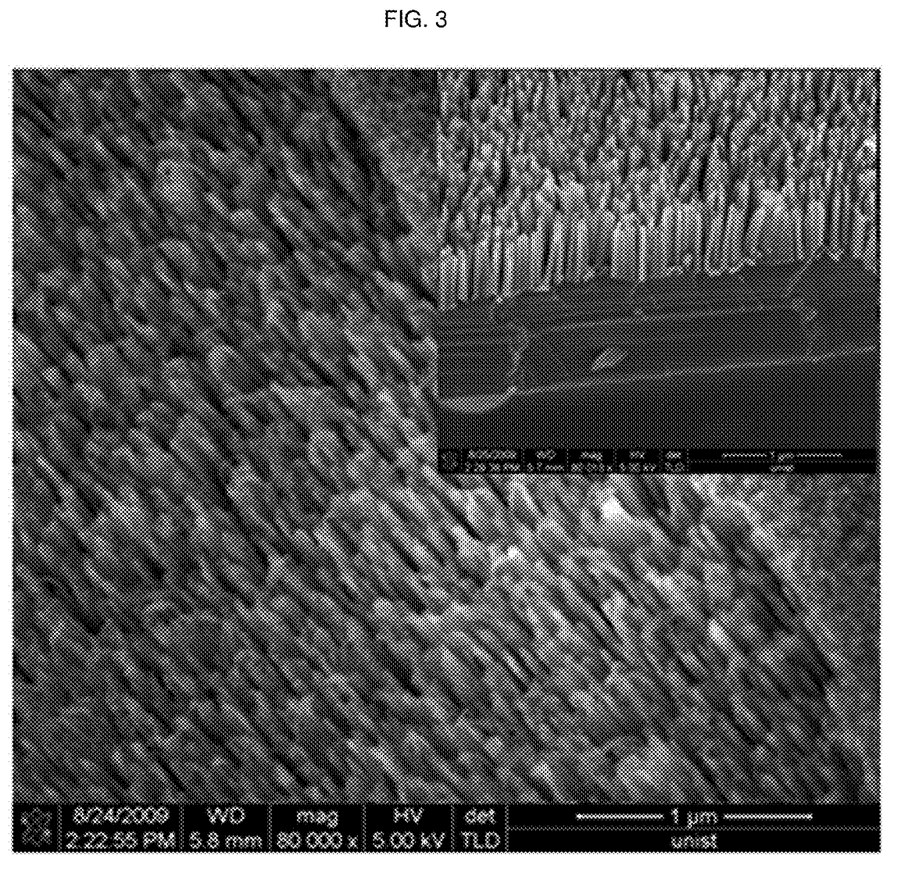
FIG. 3 provides a SEM photograph showing the side of the silicon nanowire according to Example 1 from the upper right and a SEM photograph showing the surface of the silicon nanowire according to Example 1 from the lower right.

FIG. 3 is a SEM photograph showing the surface of the silicon nanowires according to Example 1.

As shown in FIG. 3, the silicon nanowires turned out to have a uniform size and length. The silicon nanowires were about 900 nm long, since silver played a role of a catalyst and etched silicon down the silicon substrate where the silver contacted the silicon substrate, while the silver did not etch the silicon where the silver did not contact the silicon substrate due to the block copolymer.

Figure 4:
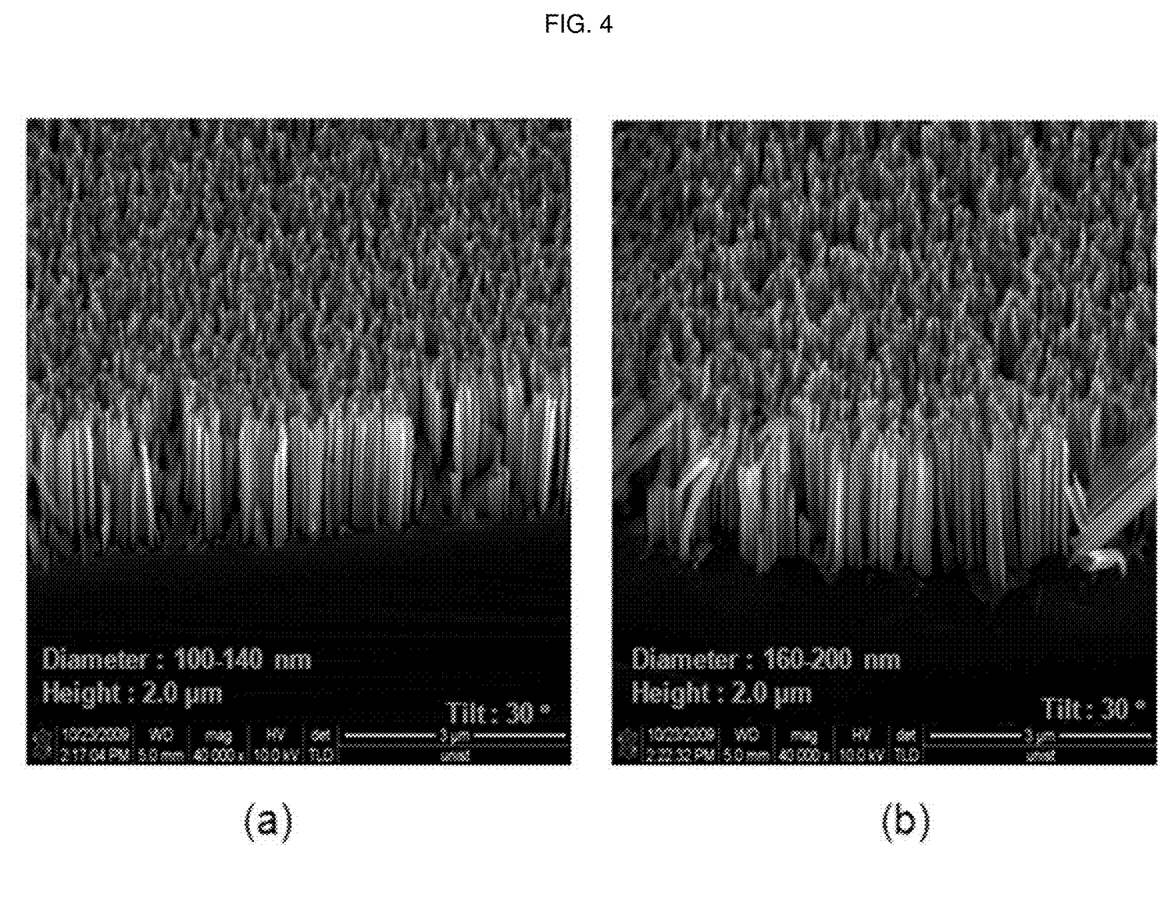
FIG. 4 provides SEM photographs showing the silicon nanowires according to Examples 2 and 3.

FIG. 4 shows SEM photographs of the silicon nanowires according to Examples 2 and 3. In FIG. 4, (a) is a SEM photograph showing the nanowire according to Example 3, while (b) is a SEM photograph showing the nanowire according to Example 2.

The nanowires according to Examples 2 and 3 were both 2 μm high.

The nanowire of Example 3 had a diameter ranging from about 100 to 140 nm, and the one of Example 2 had a diameter ranging from about 160 to 200 nm.

Herein, the nanowire of Example 3 had a larger diameter than that of Example 2. The reason is that diiron trioxide had a size determined by the molecular weight of a block copolymer in which iron(III) chloride was substituted, and Example 3 had smaller diiron trioxide than Example 2.

Figure 5:
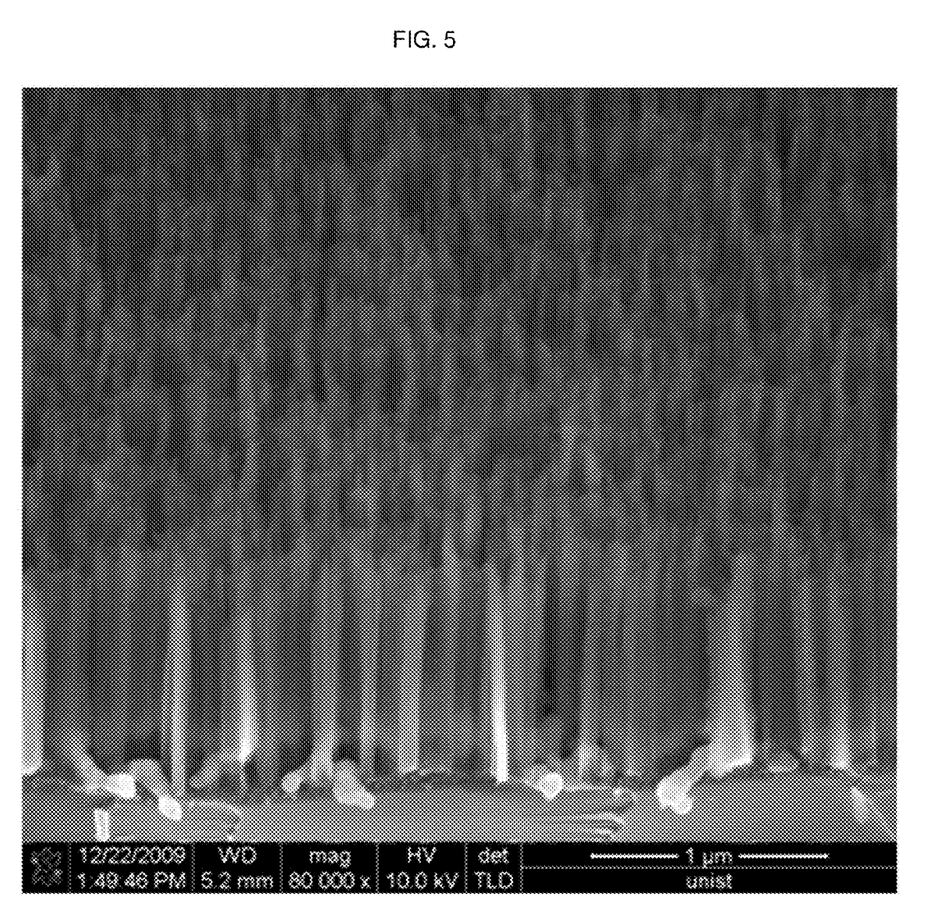
FIG. 5 is a SEM photograph showing the porous silicon nanowire having pores with a diameter of 10 nm according to Example 4.

FIG. 5 is SEM photograph showing the porous silicon nanowire having pores with a diameter of 10 nm according to Example 4. As shown in FIG. 5, the silicon nanowire fabricated by using a porous silicon substrate has a diameter ranging from 80 to 120 nm and a height of 2 μm.

Transmission Electron Microscope (TEM) Analysis

Figure 6:
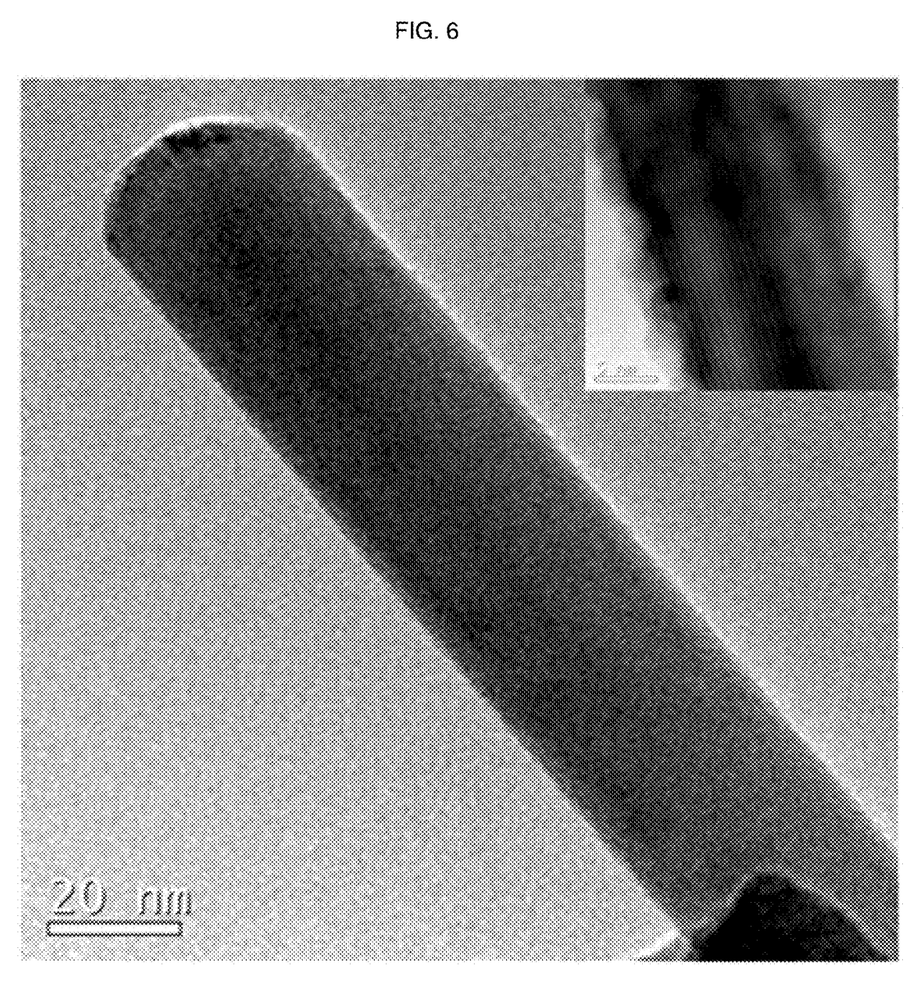
FIG. 6 is a TEM photograph showing the size and crystal shape of the nanowire according to Example 1.

FIG. 6 is TEM photograph showing size and crystal shape of the nanowire according to Example 1.

As shown in FIG. 6, the silicon nanowire according to Example 1 had a diameter of 26 nm. When enlarged for analysis, the silicon nanowire turned out to be monocrystalline.

Figure 7:
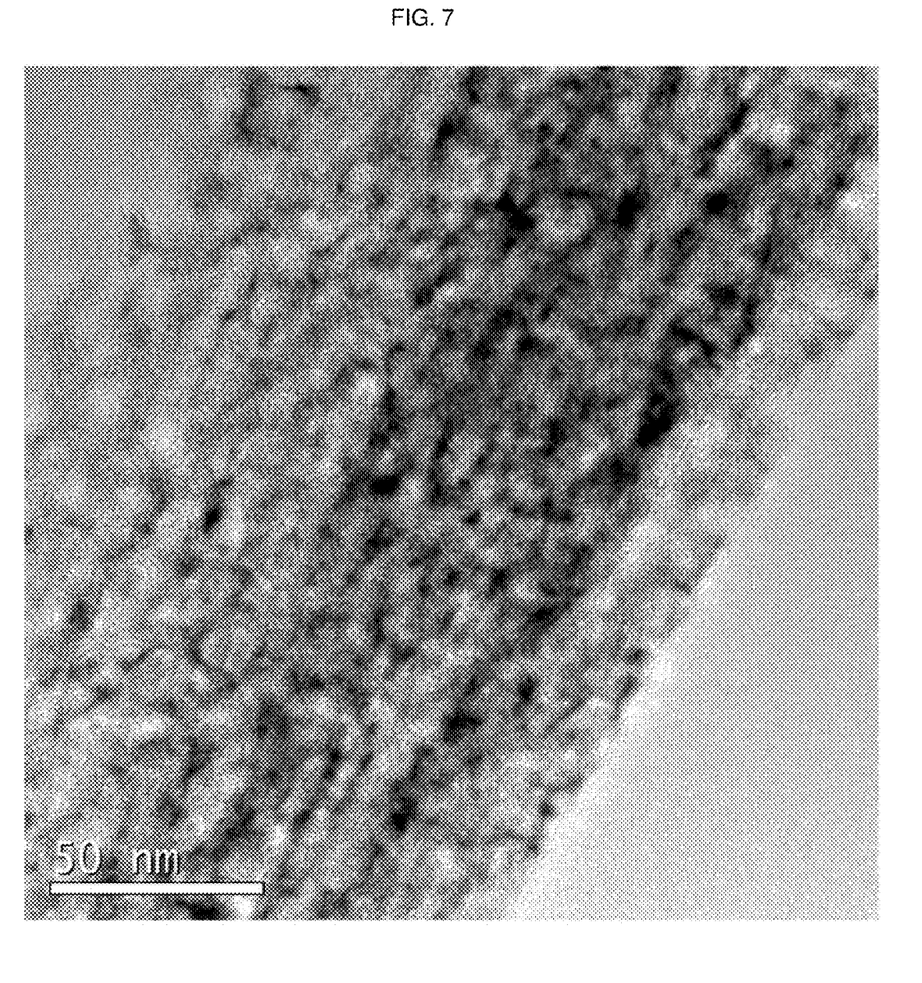
FIG. 7 is a TEM photograph showing the size and crystal shape of the silicon nanowire according to Example 4.

FIG. 7 is TEM photograph showing size and crystal shape of the nanowire according to Example 4. The silicon nanowire was about 100 nm high and had a pore diameter of less than or equal to 10 nm on the surface.

Accordingly, a silicon nanowire may be minutely controlled regarding its size by changing the molecular weight and composition of the block copolymer and thus forming a block copolymer mold.

While this invention has been described in connection with what is presently considered to be practical exemplary embodiments, it is to be understood that the invention is not limited to the disclosed embodiments, but on the contrary, is intended to cover various modifications and equivalent arrangements included within the spirit and scope of the appended claims. Therefore, the aforementioned embodiments should be understood to be exemplary but not limiting this disclosure in any way.

What is claimed is:

1. A method of manufacturing a nanowire, comprising:
   (a) preparing a substrate for manufacturing a nanowire;
   (b) preparing a block copolymer for manufacturing a nanowire;
   (c) mixing the block copolymer prepared in the step (b) with a solvent and adding a metal salt thereto to prepare a mixed solution;
   (d) applying the mixed solution prepared in the step (c) on the substrate prepared in the step (a) to form a metal salt-block copolymer layer;
   (e) plasma-treating the metal salt-block copolymer layer to form a metal oxide pattern;
   (f) forming a metal coating layer on the substrate on which the pattern is formed in the step (e); and
   (g) reacting a solution including acid and peroxide with the metal coating layer in the step (f).

2. The method of manufacturing a nanowire of claim 1, wherein the block copolymer and solvent of the step (c) are mixed at a mixed ratio where the block copolymer is mixed at 0.1 to 1.0 wt % based on the total amount, 100 wt %, of the block copolymer and solvent.

3. The method of manufacturing a nanowire of claim 1, wherein the metal salt of the step (c) is at least one selected from the group consisting of $FeCl_2$, $FeCl_3$, $K_3[Fe(CN)_6]$, and $FeSO_4$.

4. The method of manufacturing a nanowire of claim 1, wherein the metal oxide of the step (e) is an iron oxide.

* * * * *